US012119266B2

(12) United States Patent
Ching et al.

(10) Patent No.: US 12,119,266 B2
(45) Date of Patent: Oct. 15, 2024

(54) SEMICONDUCTOR ARRANGEMENT AND METHOD OF MANUFACTURE

(71) Applicant: Taiwan Semiconductor Manufacturing Company Limited, Hsin-Chu (TW)

(72) Inventors: Kuo-Cheng Ching, Zhubei (TW); Lung-Kun Chu, New Taipei (TW); Mao-Lin Huang, Hsinchu (TW); Chung-Wei Hsu, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/142,142

(22) Filed: May 2, 2023

(65) Prior Publication Data

US 2023/0268232 A1    Aug. 24, 2023

Related U.S. Application Data

(63) Continuation of application No. 17/334,848, filed on May 31, 2021, now Pat. No. 11,676,866, which is a
(Continued)

(51) Int. Cl.
*H01L 21/82* (2006.01)
*H01L 21/8234* (2006.01)
*H01L 27/088* (2006.01)
*H01L 29/49* (2006.01)
*H01L 29/51* (2006.01)
*H01L 29/66* (2006.01)

(52) U.S. Cl.
CPC ........... *H01L 21/823462* (2013.01); *H01L 21/823431* (2013.01); *H01L 27/0886* (2013.01); *H01L 29/4908* (2013.01); *H01L 29/513* (2013.01); *H01L 29/66795* (2013.01); *H01L 29/517* (2013.01); *H01L 29/518* (2013.01)

(58) Field of Classification Search
CPC .......... H01L 21/823462; H01L 29/513; H01L 29/4908; H01L 27/0886; H01L 29/66795; H01L 21/823431; H01L 29/518; H01L 29/517; H01L 29/66545; H01L 29/78696; H01L 29/42392; H01L 27/088; H01L 21/28194; H01L 29/785; H01L 29/512
USPC ........................................................ 257/401
See application file for complete search history.

(56) References Cited

U.S. PATENT DOCUMENTS 8,536,029 B1    9/2013  Chang et al.
9,905,476 B2 *  2/2018  Bao ................... H01L 27/0924
(Continued)

*Primary Examiner* — Vu A Vu
(74) *Attorney, Agent, or Firm* — Cooper Legal Group, LLC

(57) ABSTRACT

A method for forming a semiconductor arrangement comprises forming a first fin in a semiconductor layer. A first gate dielectric layer includes a first high-k material is formed over the first fin. A first sacrificial gate electrode is formed over the first fin. A dielectric layer is formed adjacent the first sacrificial gate electrode and over the first fin. The first sacrificial gate electrode is removed to define a first gate cavity in the dielectric layer. A second gate dielectric layer including a second dielectric material different than the first high-k material is formed over the first gate dielectric layer in the first gate cavity. A first gate electrode is formed in the first gate cavity over the second gate dielectric layer.

20 Claims, 17 Drawing Sheets

Related U.S. Application Data continuation of application No. 16/359,245, filed on Mar. 20, 2019, now Pat. No. 11,024,545.

(60) Provisional application No. 62/753,195, filed on Oct. 31, 2018.

(56) References Cited

U.S. PATENT DOCUMENTS

| | | | |
|---|---|---|---|
| 9,997,519 B1* | 6/2018 | Bao | H01L 27/092 |
| 10,074,575 B1* | 9/2018 | Guillorn | H01L 21/823821 |
| 10,128,379 B2* | 11/2018 | Song | H01L 29/0673 |
| 10,700,064 B1* | 6/2020 | Zhang | H01L 29/78 |
| 10,734,286 B1* | 8/2020 | Ando | H01L 29/0673 |
| 10,957,601 B2* | 3/2021 | Bi | H01L 21/02647 |
| 10,998,234 B2* | 5/2021 | Xie | H01L 29/42392 |
| 11,676,866 B2* | 6/2023 | Ching | H01L 21/823431 |
| | | | 257/401 |
| 2017/0154958 A1* | 6/2017 | Fung | H01L 29/42392 |
| 2017/0207126 A1 | 7/2017 | Ching et al. | |
| 2018/0233570 A1 | 8/2018 | Hellings | |
| 2019/0115443 A1* | 4/2019 | Ramdani | H01L 29/66462 |

\* cited by examiner

Figure 1
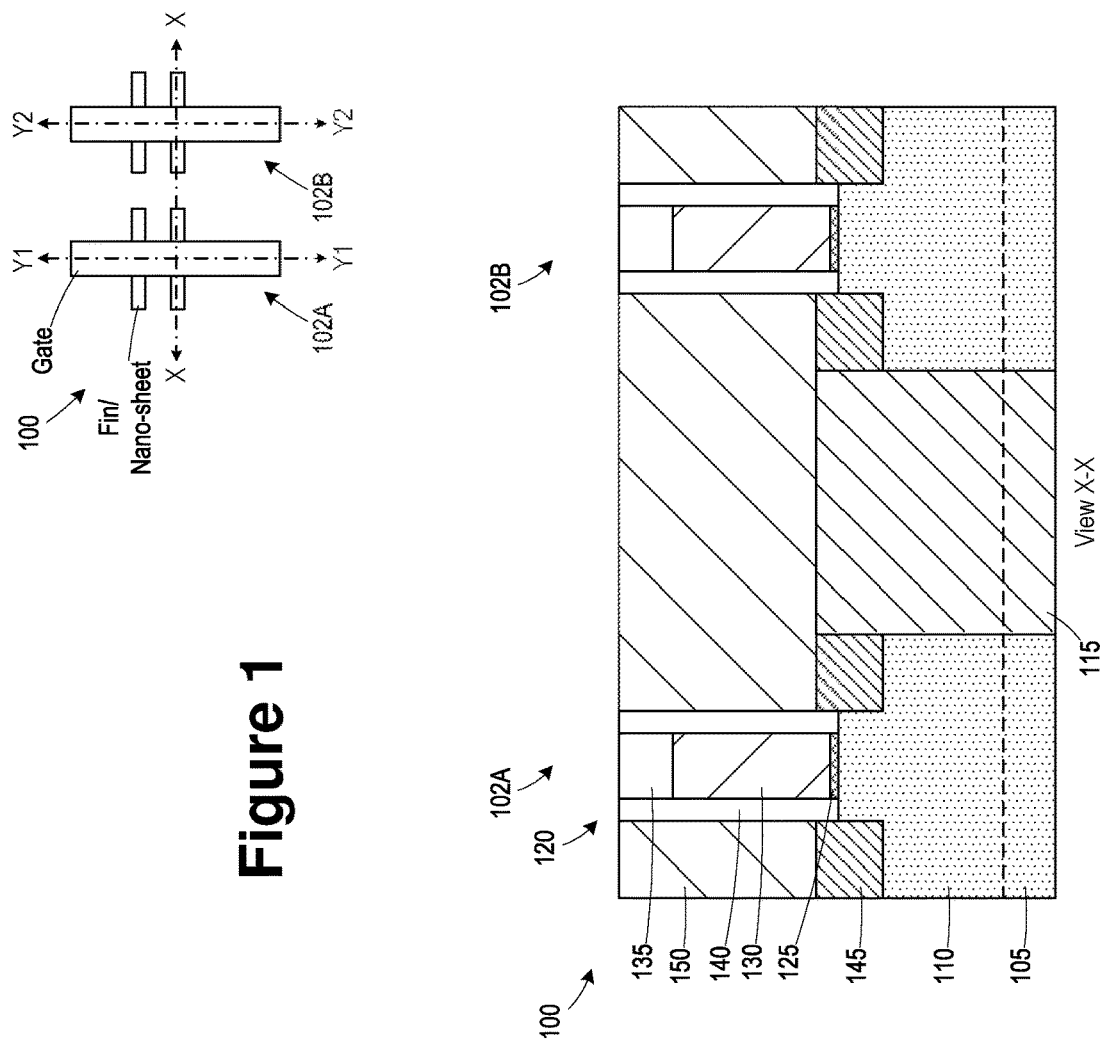
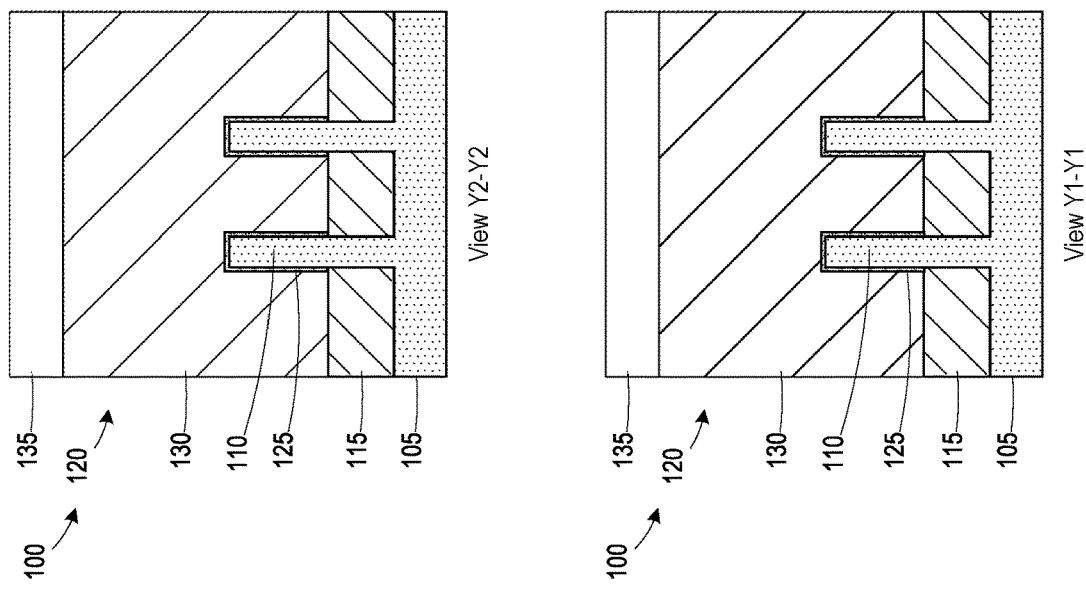

Figure 2
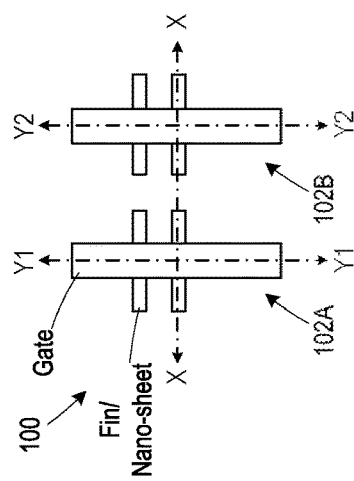
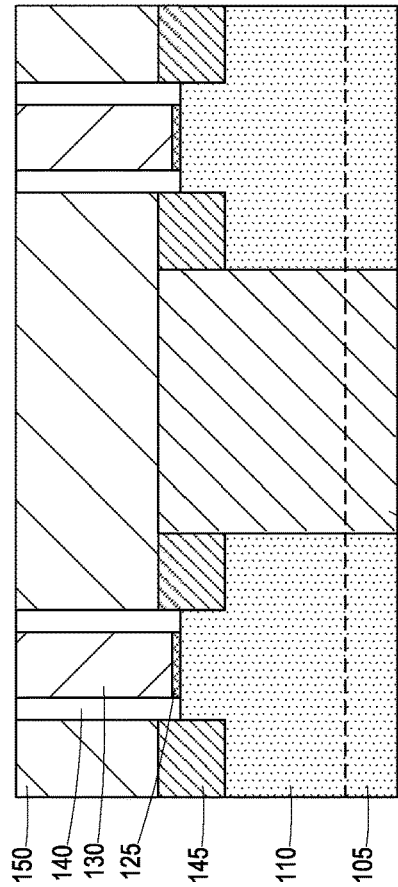
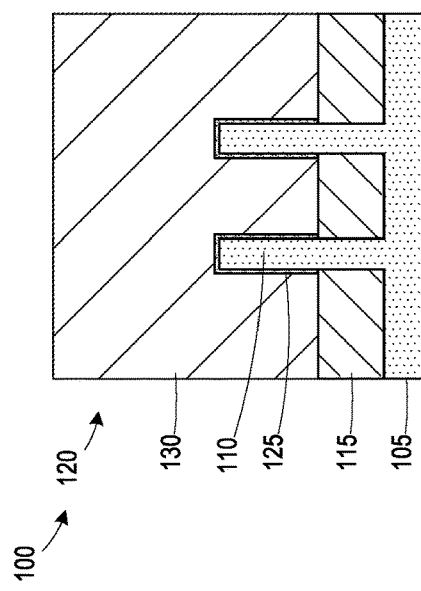
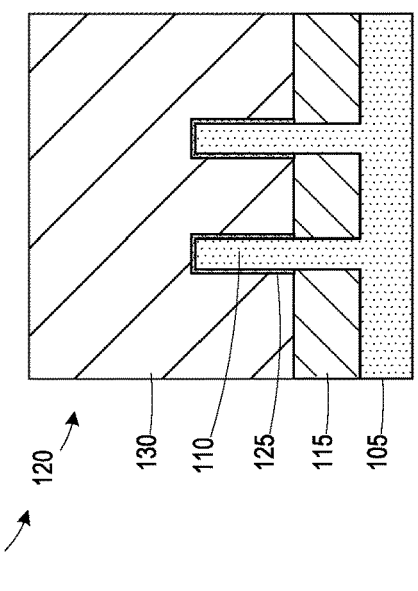

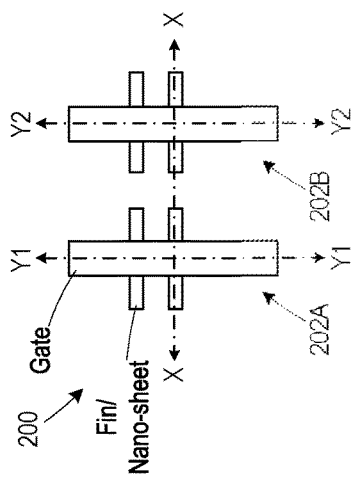
Figure 13
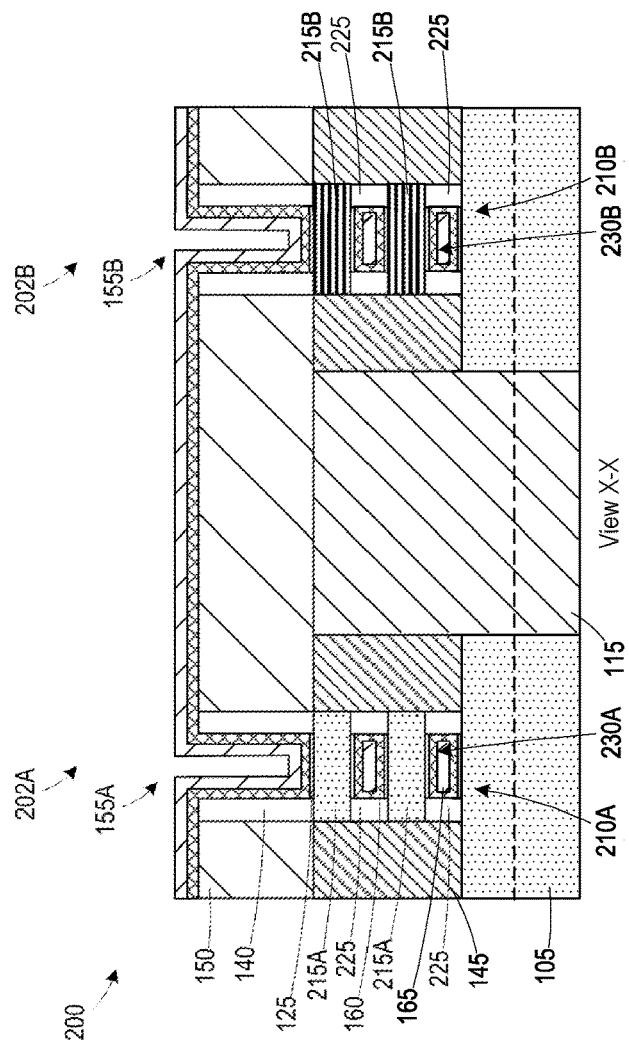
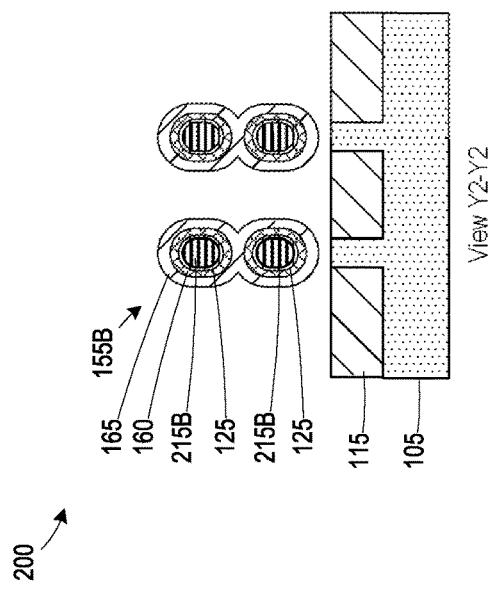
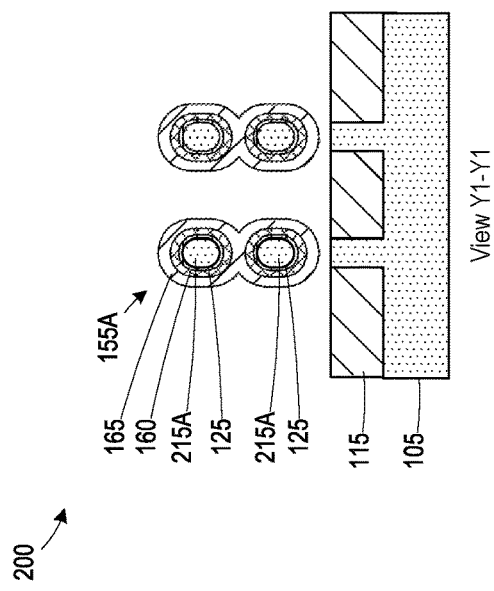

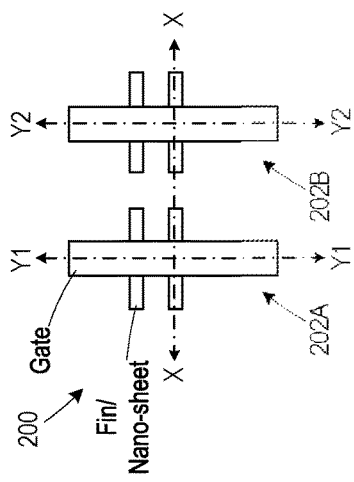
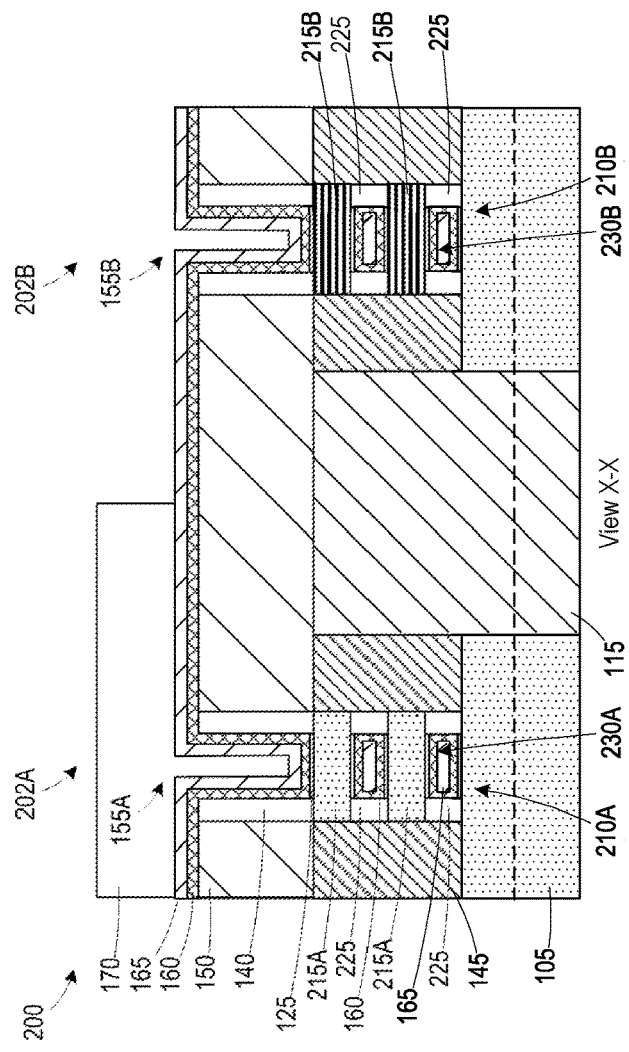
Figure 14
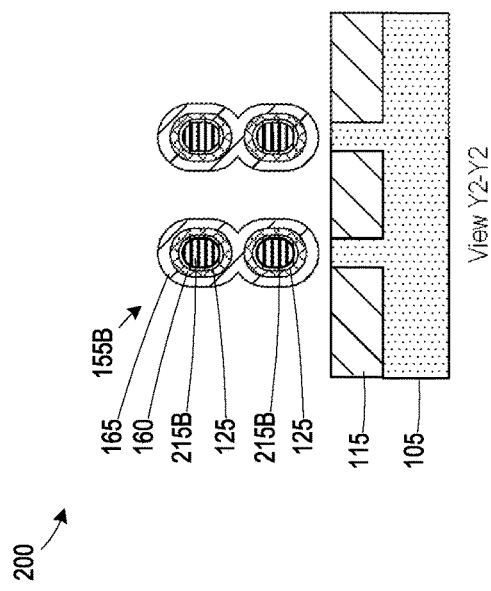
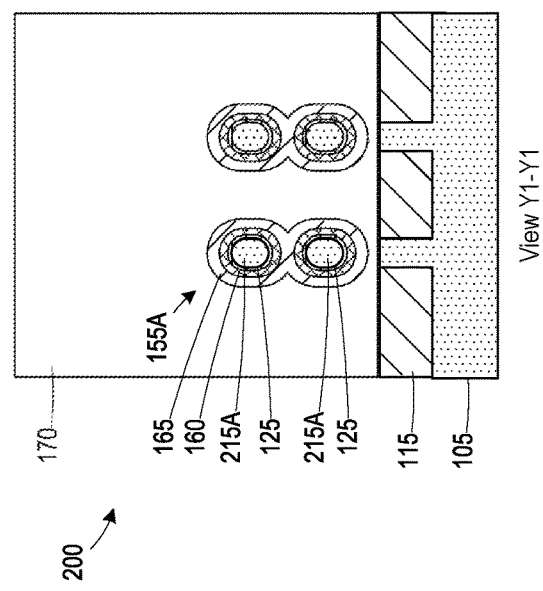

Figure 16
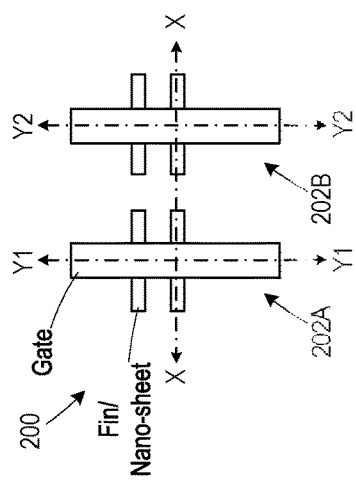
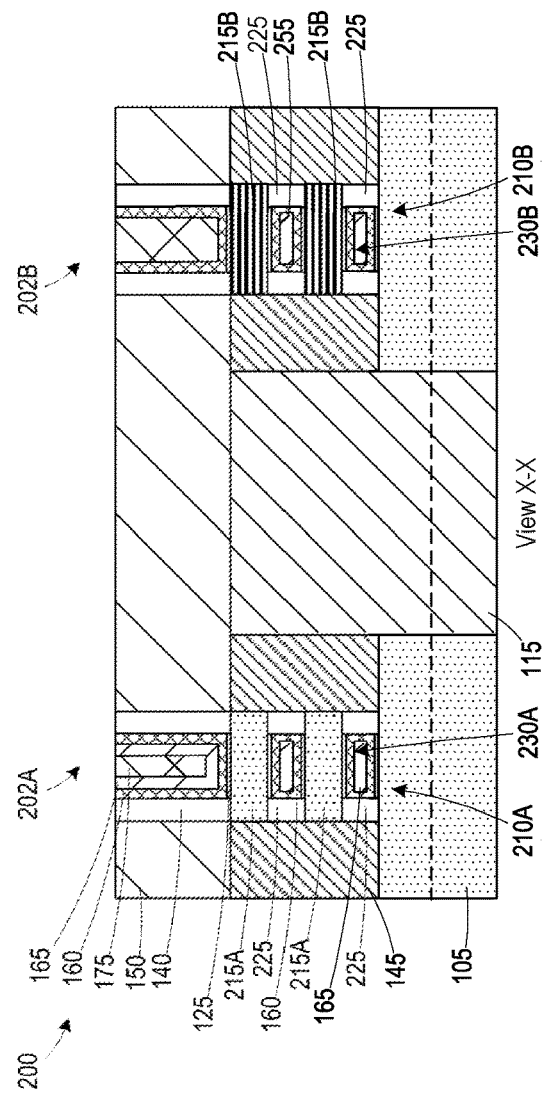
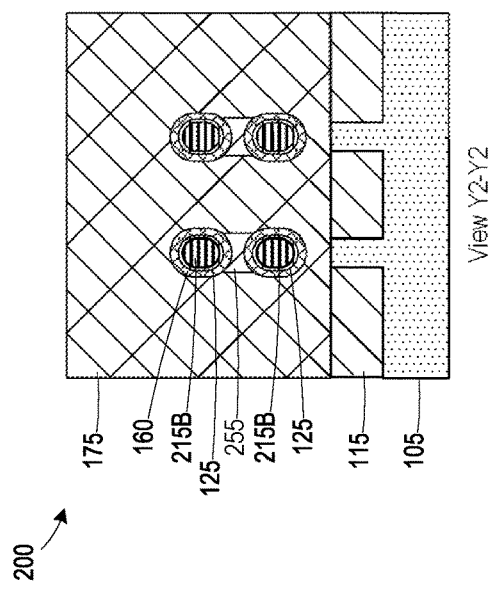
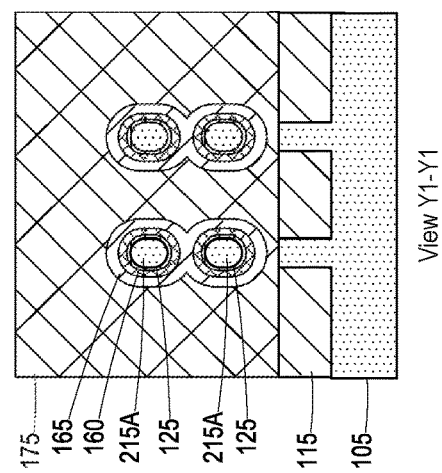

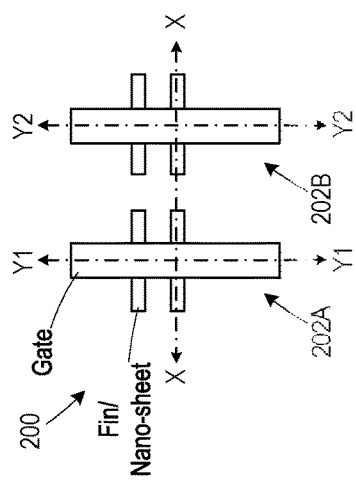
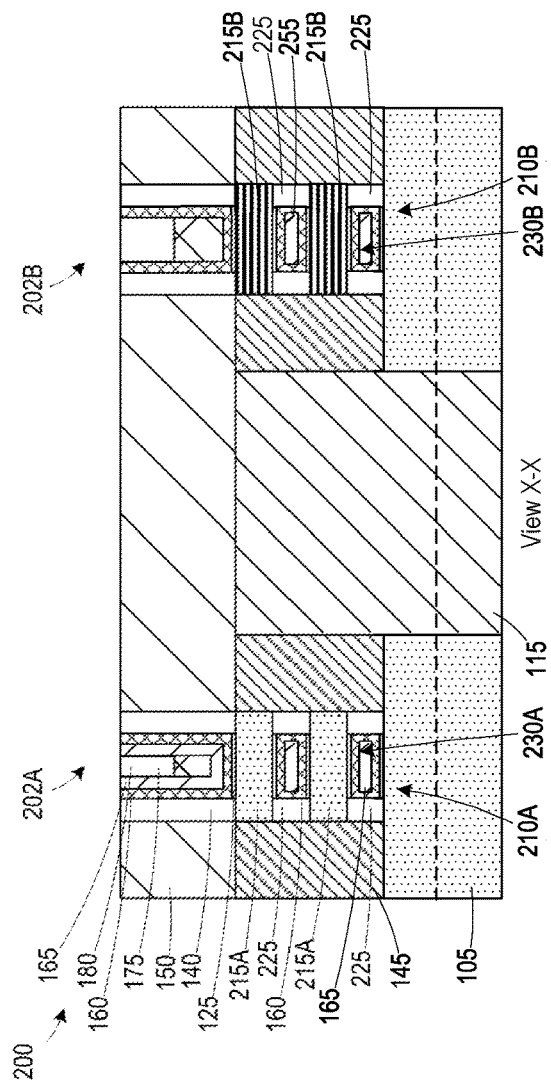
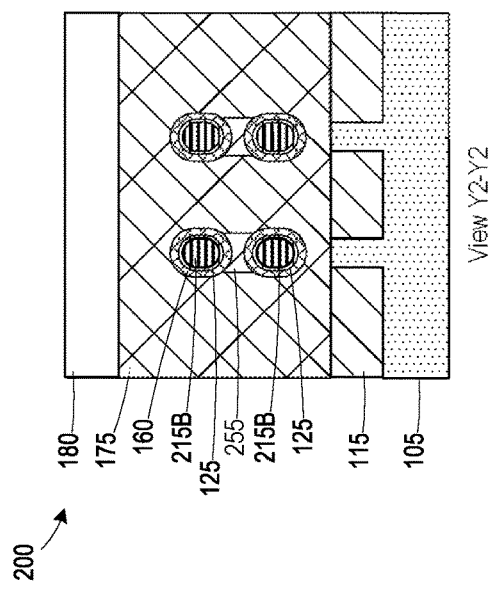
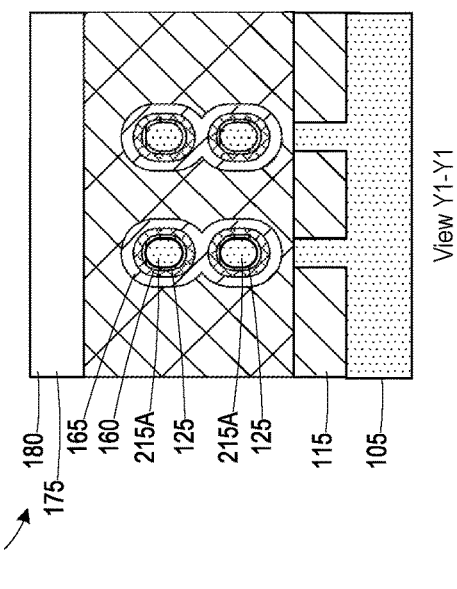
Figure 17

SEMICONDUCTOR ARRANGEMENT AND METHOD OF MANUFACTURE

RELATED APPLICATION

This application is a continuation of U.S. Non-Provisional application Ser. No. 17/334,848, titled "SEMICONDUCTOR ARRANGEMENT AND METHOD OF MANUFACTURE" and filed on May 31, 2021, which is a continuation of U.S. Non-Provisional application Ser. No. 16/359,245, titled "SEMICONDUCTOR ARRANGEMENT AND METHOD OF MANUFACTURE" and filed on Mar. 20, 2019, which claims priority to U.S. Provisional Application Ser. No. 62/753,195, titled "SEMICONDUCTOR ARRANGEMENT AND METHOD OF MANUFACTURE" and filed on Oct. 31, 2018. U.S. Non-Provisional application Ser. No. 17/334,848, U.S. Non-Provisional application Ser. No. 16/359,245, and U.S. Provisional Application Ser. No. 62/753,195 are incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET comprises an extended semiconductor fin that is elevated over a substrate in a direction substantially normal to a plane of a top surface of the substrate. A channel of the FinFET is formed in this fin. A gate is provided over (e.g., wrapping) the fin. FinFETs can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-8 are illustrations of a semiconductor arrangement at various stages of fabrication, in accordance with some embodiments.

FIGS. 9-17 are illustrations of a semiconductor arrangement at various stages of fabrication, in accordance with some embodiments.

DETAILED DESCRIPTION

Figure 3:
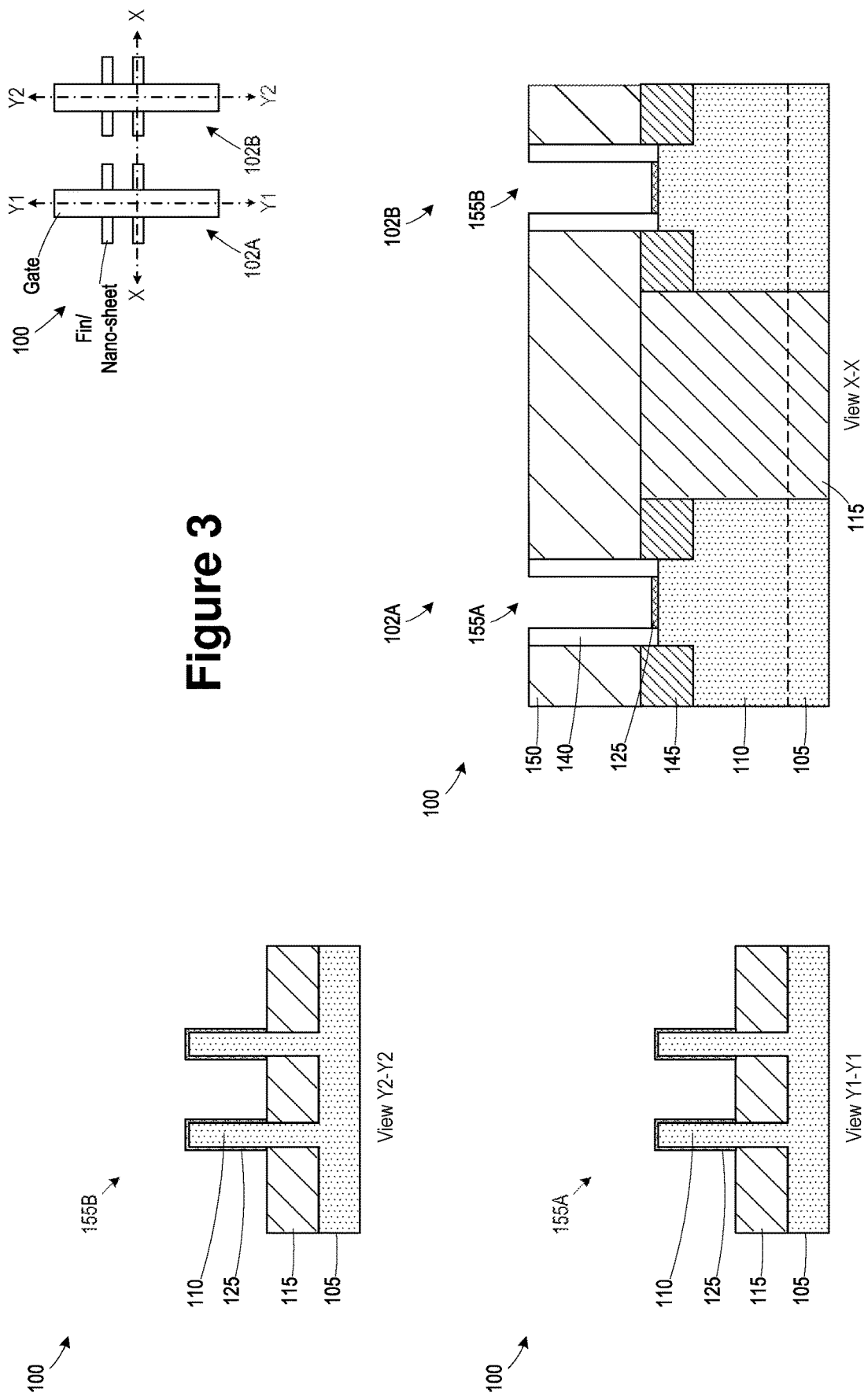

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. In some embodiments, the semiconductor arrangement comprises a FinFET or a nanosheet transistor having a single fin or multiple fins on a semiconductor layer. In some embodiments, the semiconductor arrangement comprises a first gate dielectric layer comprising a high-k dielectric material, a second gate dielectric layer comprising a different dielectric material formed over the first gate dielectric layer, and a gate electrode formed over the second gate dielectric layer.

FIGS. 1-8 are illustrations of a semiconductor arrangement 100 at various stages of fabrication, in accordance with some embodiments. FIGS. 1-8 include a simplistic plan view showing where various cross-sectional views are taken. Referring to FIG. 1, the view X-X is a cross-sectional view taken through the semiconductor arrangement 100 (in a direction corresponding to a gate length direction through fins formed in different regions), and the views Y1-Y1 and Y2-Y2 are cross-sectional views taken through the semiconductor arrangement 100 (in a direction corresponding to a gate width direction) through gate structures. Not all aspects of the processing shown in the cross-sectional views will be depicted in the plan view. In some embodiments, the devices shown in view Y1-Y1 are formed in a first region 102A of the semiconductor arrangement 100, and the devices shown in view Y2-Y2 are formed in a second region 102B of the semiconductor arrangement 100.

Referring to FIG. 1, a plurality of layers used in the formation of the semiconductor arrangement 100 are illustrated, in accordance with some embodiments. In some embodiments, the semiconductor arrangement 100 comprises fin-based transistors, such as FinFET transistors. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon.

In some embodiments, fins 110 are formed by etching trenches in the semiconductor layer 105 using a patterned hard mask. Thus, the fins 110 are formed from the semiconductor layer 105. In some embodiments, the fins 110 are formed, such as grown, over the semiconductor layer. In general, the fins 110 define an active region for forming devices, such as FinFET transistors. In some embodiments, an isolation structure 115, such as shallow trench isolation (STI), is formed by depositing a dielectric layer between the fins 110 and recessing the dielectric layer. In some embodiments, the isolation structure 115 comprises silicon and oxygen.

In some embodiments, sacrificial gate structures 120 are formed over the fins 110 and over the isolation structure 115. In some embodiments, the sacrificial gate structures 120 comprise a first gate dielectric layer 125 and a sacrificial gate electrode 130. In some embodiments, the first gate dielectric layer 125 comprises silicon and oxygen. In some embodiments, the first gate dielectric layer 125 is a native oxide layer formed by exposure of the semiconductor arrangement 100 to oxygen at various points in the process flow, causing the formation of silicon dioxide on exposed surfaces of the fins 110. According to some embodiments, the sacrificial gate structures 120 are formed by forming a layer of sacrificial material and a hard mask layer over the fins 110 and the isolation structure 115. In some embodiments, a patterning process is performed to pattern the hard mask layer corresponding to the pattern of gate structures to be formed, and an etch process is performed using the patterned hard mask layer to etch the sacrificial layer to define the sacrificial gate electrode 130. In some embodiments, remaining portions of the hard mask layer form a cap layer 135 over the sacrificial gate electrode 130.

In some embodiments, a sidewall spacer 140 is formed adjacent the sacrificial gate structure 120. In some embodiments, the sidewall spacer 140 is formed by depositing a conformal spacer layer over the sacrificial gate structures 120 and performing an anisotropic etch process to remove portions of the spacer layer positioned on horizontal surfaces of the cap layer 135, the fins 110, and the isolation structure 115. In some embodiments, the sidewall spacer 140 comprises the same material composition as the cap layer 135. In some embodiments, the sidewall spacer 140 comprises nitrogen and silicon.

In some embodiments, source/drain regions 145 are formed in the fins 110 after forming the sacrificial gate structures 120. In some embodiments, an etch process is performed to recess the fins 110 adjacent the sidewall spacer 140 and epitaxial growth process is performed to form the source/drain regions 145. In some embodiments, the source/drain regions 145 are formed by implantation of dopants into the fins 110, and the recessing and epitaxial growth processes are omitted.

In some embodiments, a dielectric layer 150 is formed over the fins 110 and adjacent the sacrificial gate structures 120. In some embodiments, the dielectric layer 150 is planarized to expose the cap layers 135. In some embodiments, the dielectric layer 150 comprises silicon dioxide or a low-k material. In some embodiments, the dielectric layer 150 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. The materials for the dielectric layer 150 comprise at least one of Si, O, C, or H, such as SiCOH and SiOC, or other suitable materials. Organic material such as polymers may be used for the dielectric layer 150. In some embodiments, the dielectric layer 150 comprises one or more layers of a carbon-containing material, organo-silicate glass, a porogen-containing material, or combinations thereof. The dielectric layer 150 may also comprise Nitrogen in some embodiments. The dielectric layer 150 may be formed by using, for example, at least one of plasma-enhanced chemical vapor deposition (PECVD), low pressure CVD (LPCVD), atomic layer CVD (ALCVD), or a spin-on technology. In some embodiments where the dielectric layer is formed using PECVD, the dielectric layer 150 is deposited at a substrate temperature in a range of about 25° C. to about 400° C. and at a pressure of less than 100 Torr.

Referring to FIG. 2, a planarization process is performed to remove the cap layer 135 and to reduce a height of the sidewall spacer 140 and the dielectric layer 150, in accordance with some embodiments. The planarization process exposes the sacrificial gate electrode 130. In some embodiments, the planarization process is a continuation of the process performed to planarize the dielectric layer 150.

Referring to FIG. 3, an etch process is performed to remove the sacrificial gate electrode 130 to define gate cavities 155A, 155B. In some embodiments, the etch process is a wet etch process selective to the material of the sacrificial gate electrode 130. In some embodiments, an etch process is performed to remove the first gate dielectric layer 125. In some embodiments, another insulating layer is grown at a same time in gate cavities 155A, 155B after the removal of the first gate dielectric layer 125. The another insulating layer comprises a same or different material from the first gate dielectric layer 125.

Figure 4:
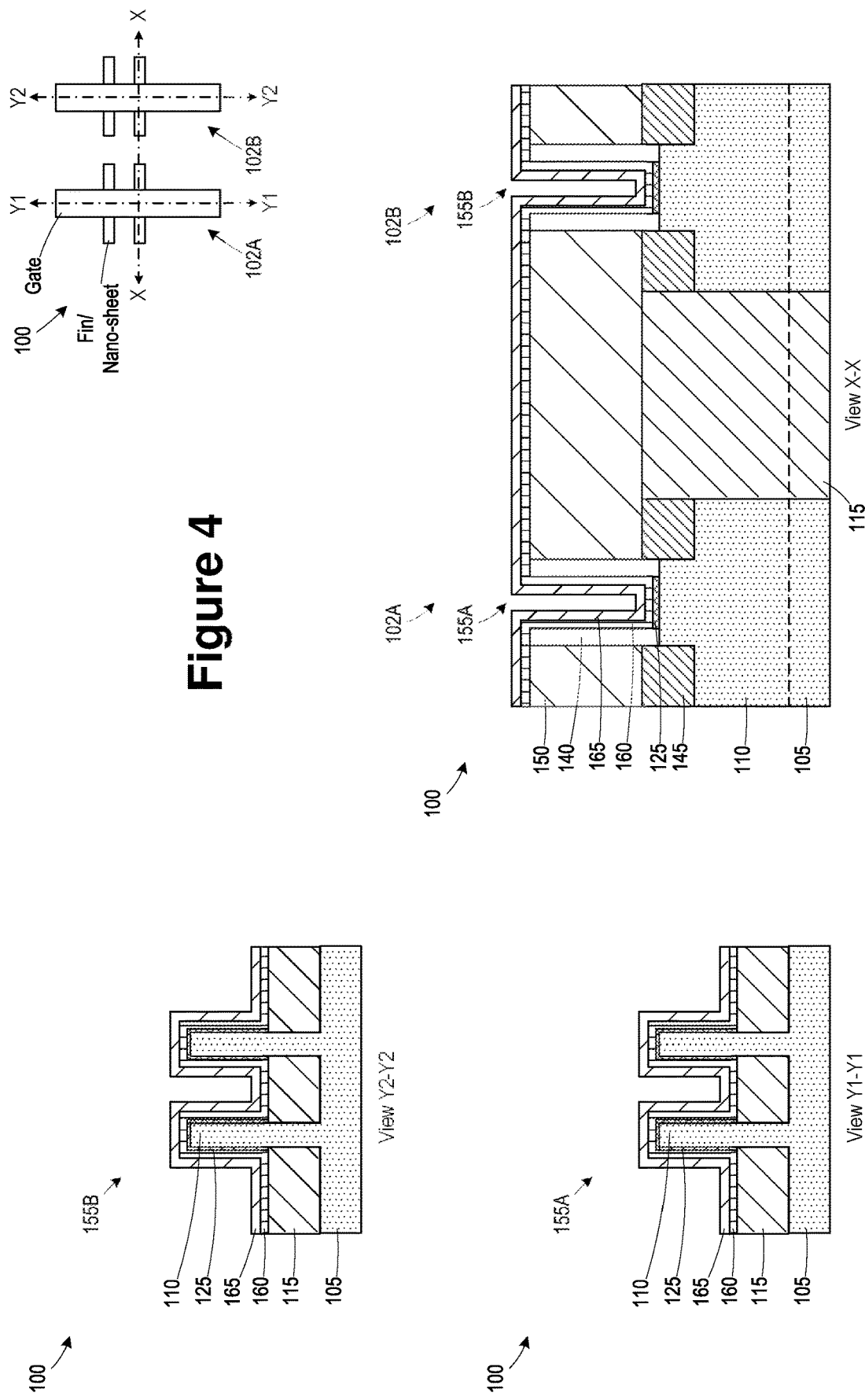

Referring to FIG. 4, deposition processes are performed to form a second gate dielectric layer 160 in the gate cavities 155A, 155B and over the dielectric layer 150 and to form a third gate dielectric layer 165 over the second gate dielectric layer 160, in accordance with some embodiments. In some embodiments, the second gate dielectric layer 160 comprises a high-k dielectric layer. As used herein, the term "high-k dielectric" refers to the material having a dielectric constant, k, greater than about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2. In some embodiments, the third gate dielectric layer 165 comprises silicon and oxygen. In some embodiments, the third gate dielectric layer 165 comprises a different material composition than the second gate dielectric layer 160. In some embodiments, a thickness of the second gate dielectric layer 160 in the first region 102A is substantially the same as that in the second region 102B. In some embodiments, a thickness of the first gate dielectric layer 125 in the first region 102A is substantially the same as that in the second region 102B.

Figure 5:
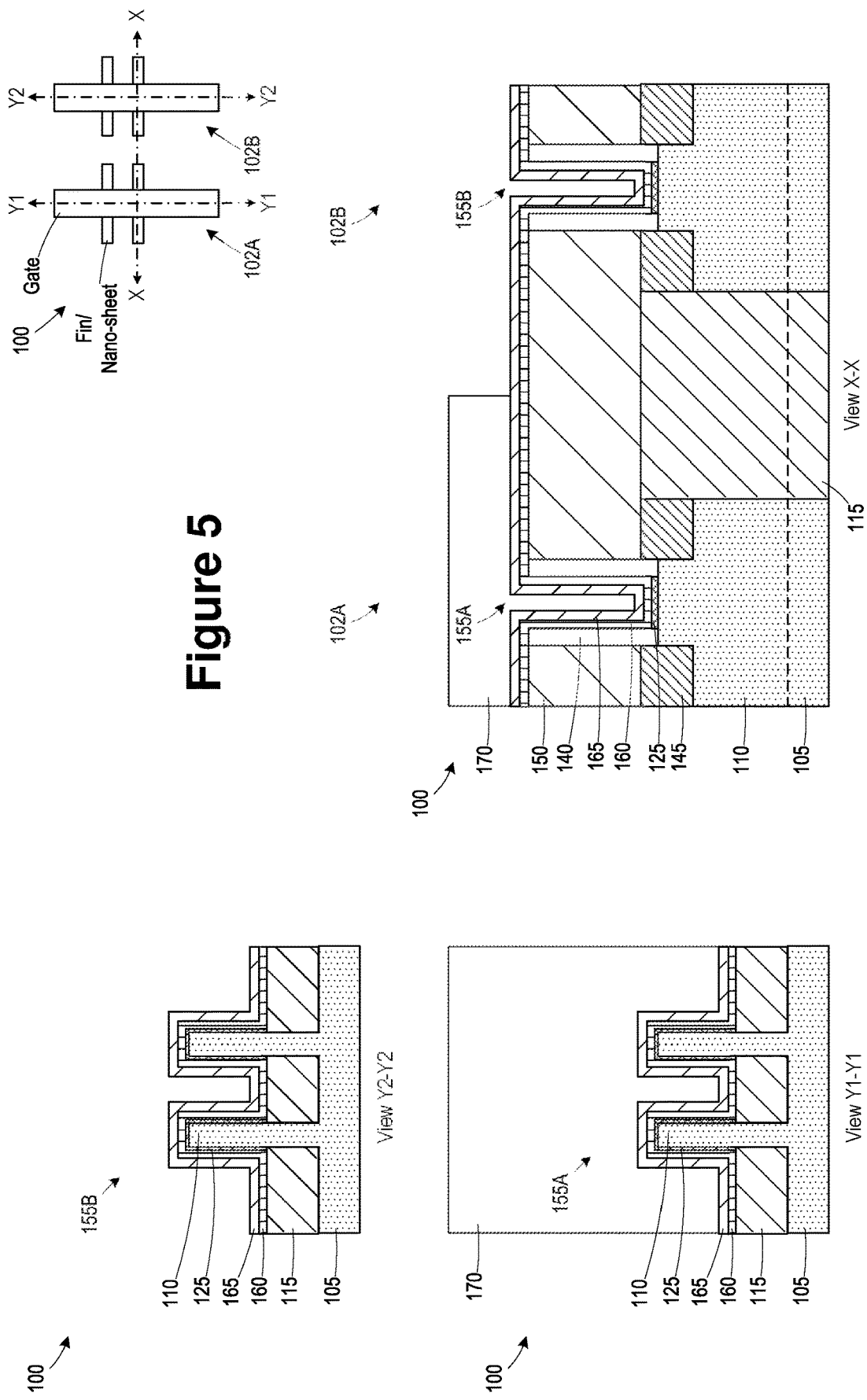

Referring to FIG. 5, a process is performed to form a patterned mask layer 170 in the gate cavity 155A in the first region 102A, in accordance with some embodiments. The patterned mask layer 170 exposes the gate cavity 155B in the second region 102B. In some embodiments, the patterned mask layer 170 comprises photoresist.

Figure 6:
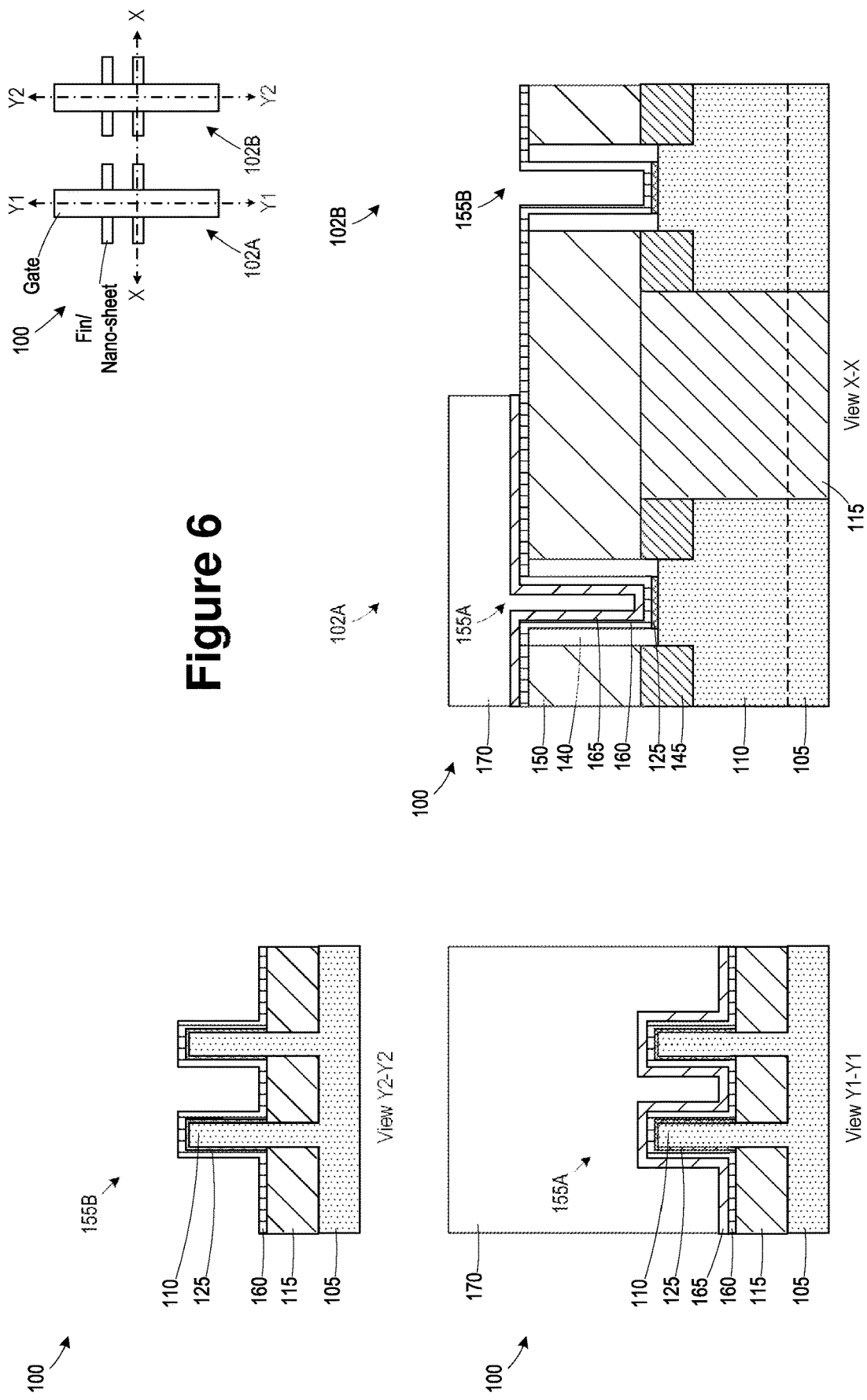

Referring to FIG. 6, an etch process is performed to remove the third gate dielectric layer 165 in the second region 102B, in accordance with some embodiments. According to some embodiments, the material of the third gate dielectric layer 165 is selected to provide etch selectivity with respect to the second gate dielectric layer 160.

Figure 7:
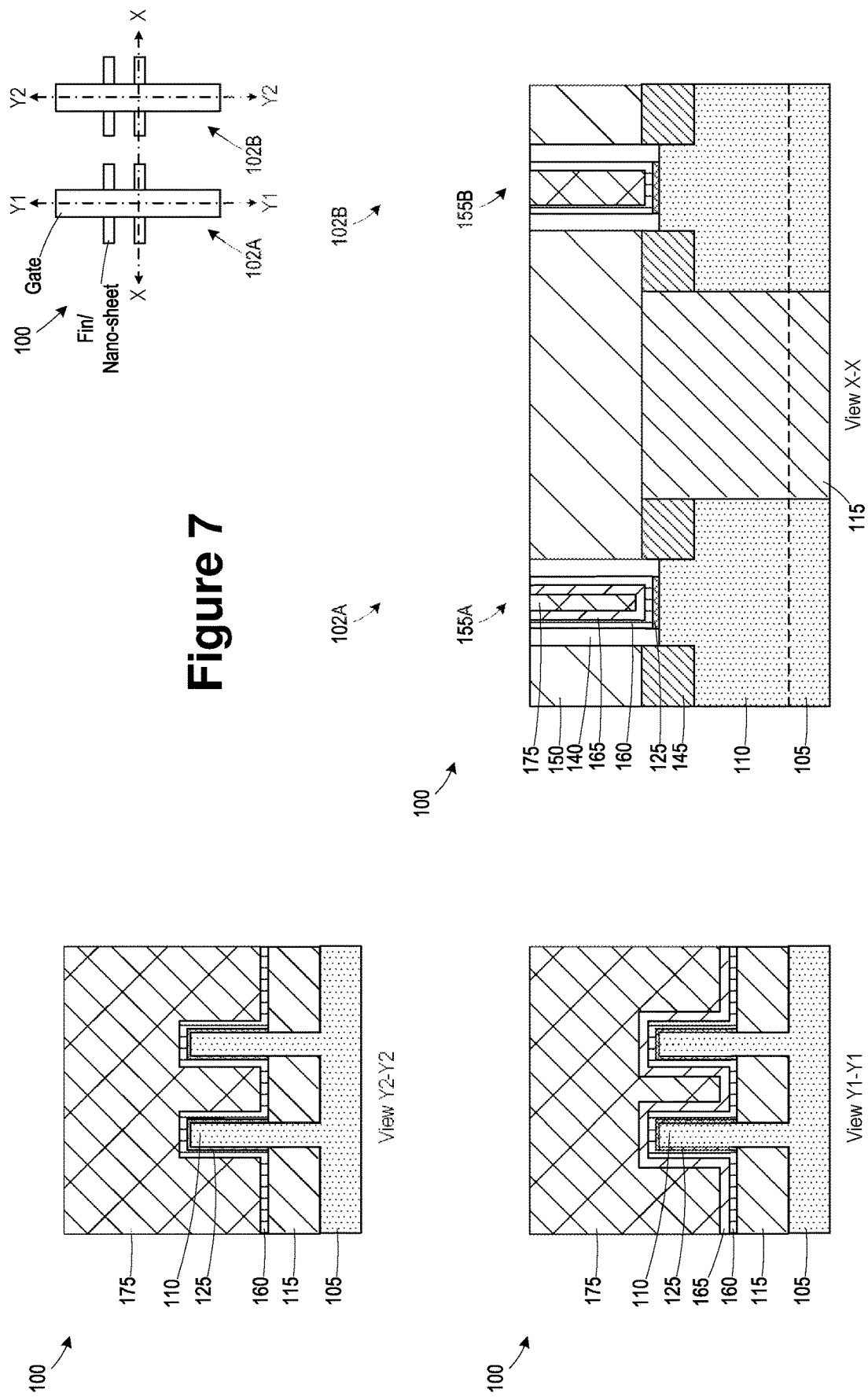

Referring to FIG. 7, the patterned mask layer 170 is removed and processes are performed to form a gate electrode 175 in the gate cavities 155A, 155B, in accordance with some embodiments. In some embodiments, the gate electrode 175 comprises suitable layers in a metal gate stack. In some embodiments, the metal gate stack comprises a work function material (WFM) layer. Example p-type work function metals include TiN, TaN, Ru, Mo, Al, WN, ZrSi2, MoSi2, TaSi2, NiSi2, WN, other suitable p-type work function materials, or combinations thereof. Example n-type work function metals include Ti, Ag, TaAl, TaAlC, TiAlN, TaC, TaCN, TaSiN, Mn, Zr, other suitable n-type work function materials, or combinations thereof. The WFM layer may comprise a plurality of layers. In some embodiments, a barrier layer is formed prior to the formation of WFM layer. In some embodiments, the combination of WFM layer(s) in the first region 102A is different from that in the second region 102B. The WFM layer may be deposited by at least one of CVD, PVD, electroplating, or other suitable process. In some embodiments, the metal gate stack comprises a fill layer. In some embodiments, the fill layer comprises tungsten (W) or other suitable material. The fill layer may be deposited by at least one of ALD, PVD, CVD, or other suitable processes. In some embodiments, in the first region 102A the third gate dielectric layer 165 is sandwiched between the WFM layer(s) and the second gate dielectric layer 160. According to some embodiments, a planarization process is performed to remove portions of the material forming the gate electrode 175, the second gate dielectric layer 160, and the third gate dielectric layer 165 positioned over the dielectric layer 150.

Figure 8:
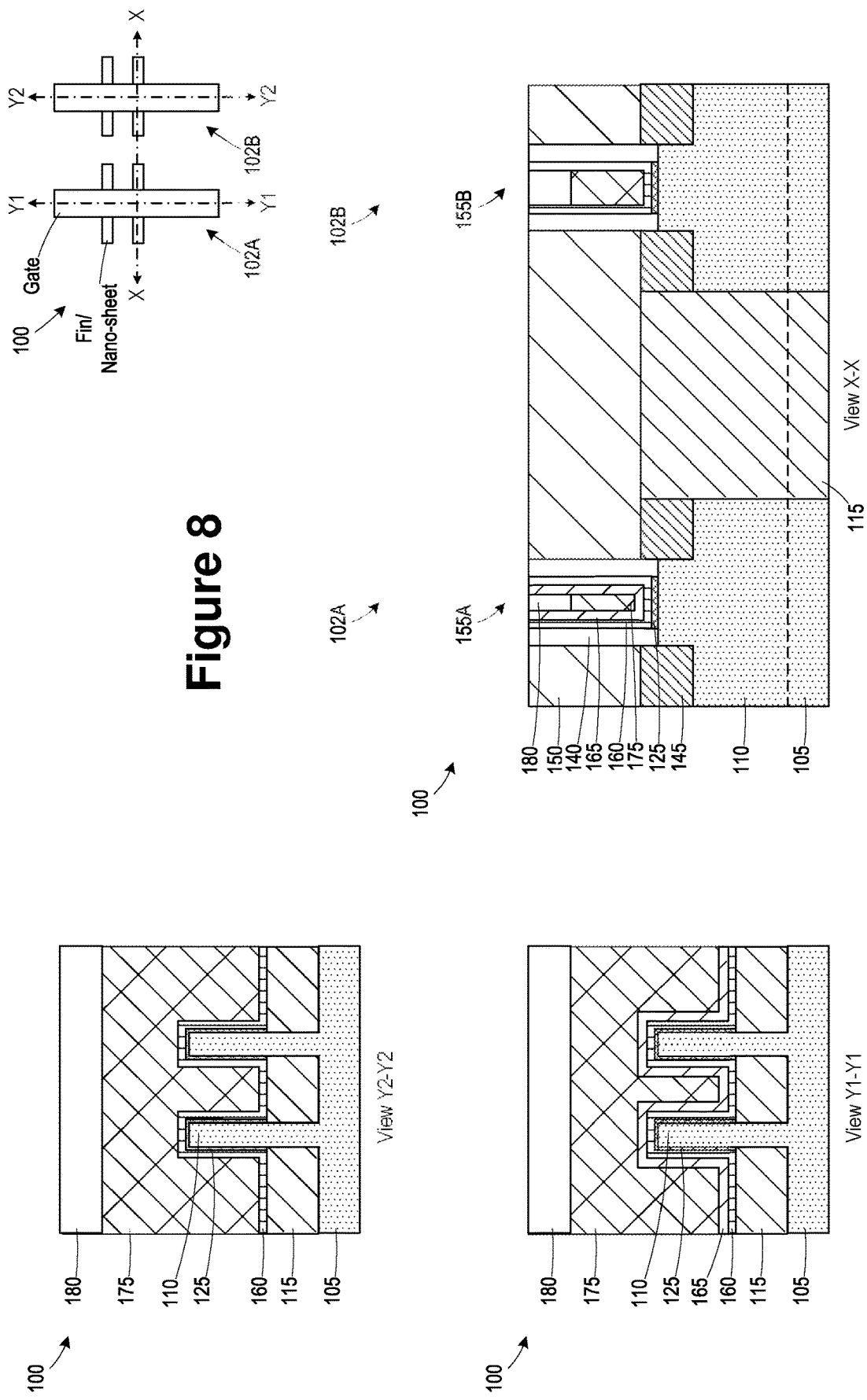

Referring to FIG. 8, an optional recess etch process is performed to recess the gate electrode 175 and a deposition process is performed to form an optional cap layer 180 over the gate electrode 175, in accordance with some embodiments. In some embodiments, the cap layer 180 comprises silicon and nitrogen. In some embodiments, the cap layer 180 comprises silicon and oxygen.

In some embodiments, the devices in the first region 102A comprise the first gate dielectric layer 125 (i.e., if not removed), the second gate dielectric layer 160, and the third gate dielectric layer 165, and the devices in the second region 102B comprise the first gate dielectric layer 125 (i.e., if not removed) and the second gate dielectric layer 160. In some embodiments, the first region 102A is logic region or an input/output region, and the second region 102B is a logic region or a core region. In some embodiments, the devices in the first region 102A operate at a higher voltage than the devices in the second region 102B. Forming the third gate dielectric layer 165 during the replacement gate segment of the fabrication flow reduces the aspect ratio of the space between the fins 110 when the material of the sacrificial gate electrode 130 is initially formed as compared to forming the third gate dielectric layer 165 prior to forming the material of the sacrificial gate electrode 130. In some embodiments, the second gate dielectric layer 160 is formed prior to forming the material of the sacrificial gate electrode 130 without compromising the aspect ratio.

Figure 9:
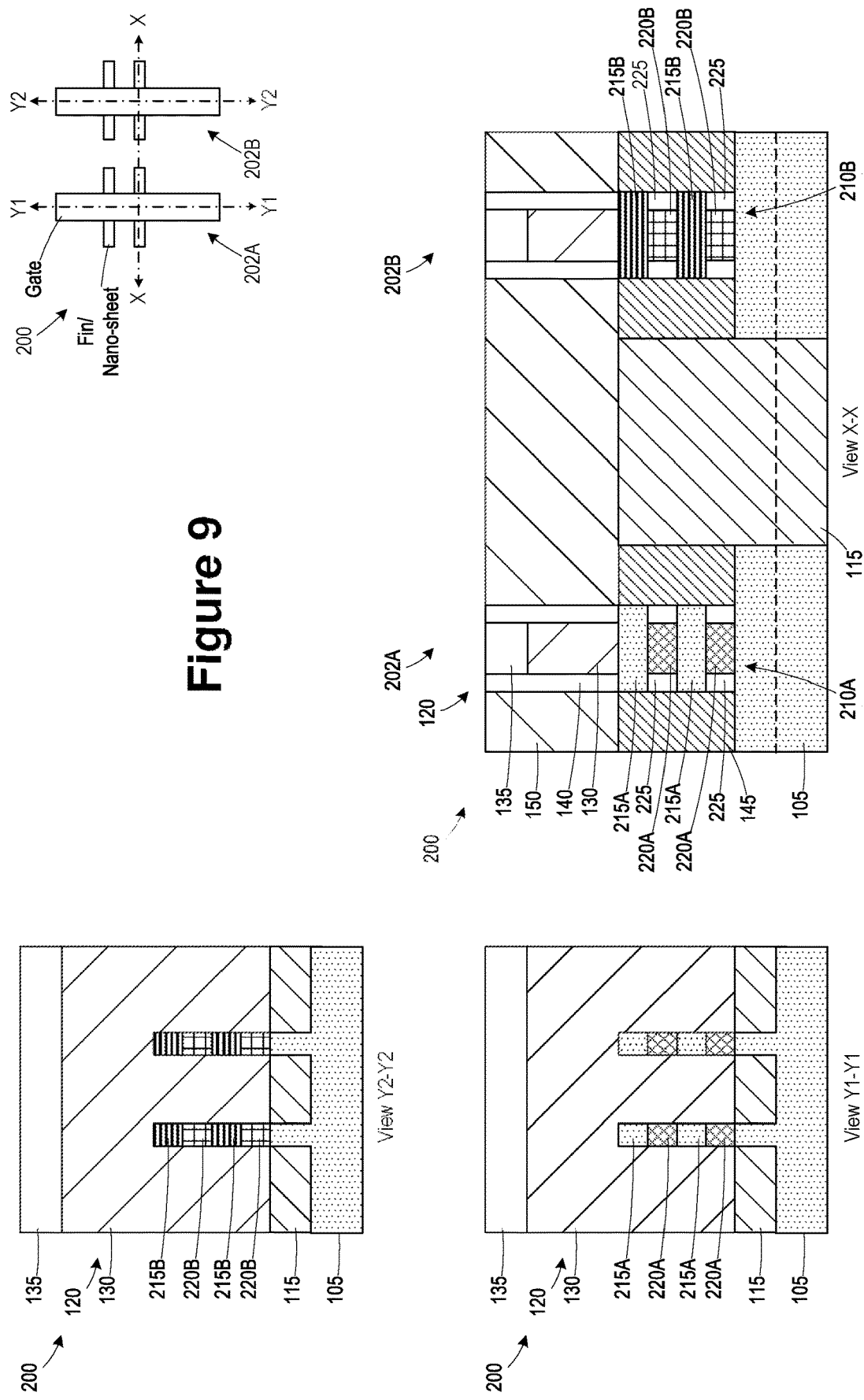

FIGS. 9-17 are illustrations of a semiconductor arrangement 200 at various stages of fabrication, in accordance with some embodiments. FIGS. 9-17 include a simplistic plan view showing where various cross-sectional views are taken. Referring to FIG. 9, the view X-X is a cross-sectional view taken through the semiconductor arrangement 200 (in a direction corresponding to a gate fin length direction through fins formed in different regions, and the views Y1-Y1 and Y2-Y2 are cross-sectional views taken through the semiconductor arrangement 200 (in a direction corresponding to a gate length direction) through gate structures. Not all aspects of the processing shown in the cross-sectional views will be depicted in the plan view. In some embodiments, the devices shown in view Y1-Y1 are formed in a first region 202A of the semiconductor arrangement 200, and the devices shown in view Y2-Y2 are formed in a second region 202B of the semiconductor arrangement 200.

Referring to FIG. 9, a plurality of layers used in the formation of the semiconductor arrangement 200 are illustrated, in accordance with some embodiments. In some embodiments, the semiconductor arrangement 200 comprises nano-sheet based transistors. In some embodiments, fins 210A, 210B are formed by forming a stack of semiconductor material layers. In some embodiments, the fins 210A, 210B comprises active semiconductor material layers 215A, 215B and sacrificial semiconductor layers 220A, 220B. The materials of the active semiconductor material layers 215A, 215B are different than the materials of the sacrificial semiconductor layers 220A, 220B to provide etch selectivity and allow removal of the sacrificial semiconductor layers 220A, 220B.

In some embodiments, the active semiconductor material layers 215A, 215B comprise the same material composition and the sacrificial semiconductor layers 220A, 220B comprise the same material composition. In some embodiments, the active semiconductor material layers 215A, 215B comprise substantially pure silicon, and the sacrificial semiconductor layers 220A, 220B comprise silicon-germanium ($Si_xGe_{(1-x)}$ where x ranges from 0.25 to 0.85).

In some embodiments, the active semiconductor material layers 215A, 215B are different materials and the sacrificial semiconductor layers 220A, 220B are the different materials. In some embodiments, the active semiconductor material layers 215A comprise substantially pure silicon, and the active semiconductor material layers 215B comprise silicon-germanium ($Si_xGe_{(1-x)}$ where x ranges from 0.25 to 0.85). In some embodiments, the sacrificial semiconductor layers 220A, 220B comprise different alloy concentrations of Ge to provide etch selectivity with respect to the active semiconductor material layers 215A, 215B.

In some embodiments, the number of active semiconductor material layers 215A, 215B and sacrificial semiconductor layers 220A, 220B is more than two. In some embodiments, the order of the active semiconductor material layers 215A, 215B and sacrificial semiconductor layers 220A, 220B vary between the fin 210A and the fin 210B. In some embodiments, thicknesses of the active semiconductor material layers 215A, 215B and sacrificial semiconductor layers 220A, 220B vary, and the thicknesses need not be the same.

In some embodiments, the isolation structure 115, such as shallow trench isolation (STI), is formed by depositing a dielectric layer between the fins 210A, 210B and recessing the dielectric layer. In some embodiments, the isolation structure 115 comprises silicon and oxygen.

In some embodiments, sacrificial gate structures 120 are formed over the fins 210A, 210B and over the isolation structure 115. In some embodiments, the sacrificial gate structures 120 comprise a sacrificial gate electrode 130.

According to some embodiments, the sacrificial gate structures 120 are formed by forming a layer of sacrificial material and a hard mask layer over the fins 210A, 210B and the isolation structure 115. In some embodiments, a patterning process is performed to pattern the hard mask layer corresponding to the pattern of gate structures to be formed, and an etch process is performed using the patterned hard mask layer to etch the sacrificial layer to define the sacrificial gate electrode 130. In some embodiments, remaining portions of the hard mask layer form a cap layer 135 over the sacrificial gate electrode 130.

In some embodiments, a sidewall spacer 140 is formed adjacent the sacrificial gate structure 120. In some embodiments, the sidewall spacer 140 is formed by depositing a conformal spacer layer over the sacrificial gate structures 120 and performing an anisotropic etch process to remove portions of the spacer layer positioned on horizontal surfaces of the cap layer 135, the fins 210A, 210B, and the isolation structure 115. In some embodiments, the sidewall spacer 140 comprises the same material composition as the cap layer 135. In some embodiments, the sidewall spacer 140 comprises nitrogen and silicon.

In some embodiments, end spacers 225 are formed adjacent ends of the sacrificial semiconductor layers 220A, 220B. In some embodiments, after forming the fins 210A, 210B, an isotropic etch process is performed to recess the sacrificial semiconductor layers 220A, 220B to define end cavities. A deposition process is performed to form a dielectric spacer layer over the fins 210A, 210B and an isotropic etch process is performed to remove portions of the dielectric spacer layer outside the end cavities to define the end spacers 225. In some embodiments, the end spacers 225 comprise the same material composition as the sidewall spacers 140.

In some embodiments, source/drain regions 145 are formed in the fins 210A, 210B after forming the sacrificial gate structures 120 and after forming the end spacers 225. In some embodiments, an etch process is performed to recess the fins 210A, 210B adjacent the sidewall spacer 140 and epitaxial growth process is performed to form the source/drain regions 145.

In some embodiments, a dielectric layer 150 is formed over the fins 210A, 210B and adjacent the sacrificial gate structures 120. In some embodiments, the dielectric layer 150 is planarized to expose the cap layers 135. In some embodiments, the dielectric layer 150 comprises silicon dioxide or a low-k material. In some embodiments, the dielectric layer 150 comprises one or more layers of low-k dielectric material. The materials for the dielectric layer 150 comprise at least one of Si, O, C, or H, such as SiCOH and SiOC, or other suitable materials. Organic material such as polymers may be used for the he dielectric layer 150. In some embodiments, the dielectric layer 150 comprises one or more layers of a carbon-containing material, organosilicate glass, a porogen-containing material, or combinations thereof. The dielectric layer 150 may also comprise Nitrogen in some embodiments. The dielectric layer 150 may be formed by using, for example, at least one of plasma-enhanced chemical vapor deposition (PECVD), low pressure CVD (LPCVD), atomic layer CVD (ALCVD), or a spin-on technology. In some embodiments where the dielectric layer is formed using PECVD, the dielectric layer 150 is deposited at a substrate temperature in a range of about 25° C. to about 400° C. and at a pressure of less than 100 Torr.

Figure 10:
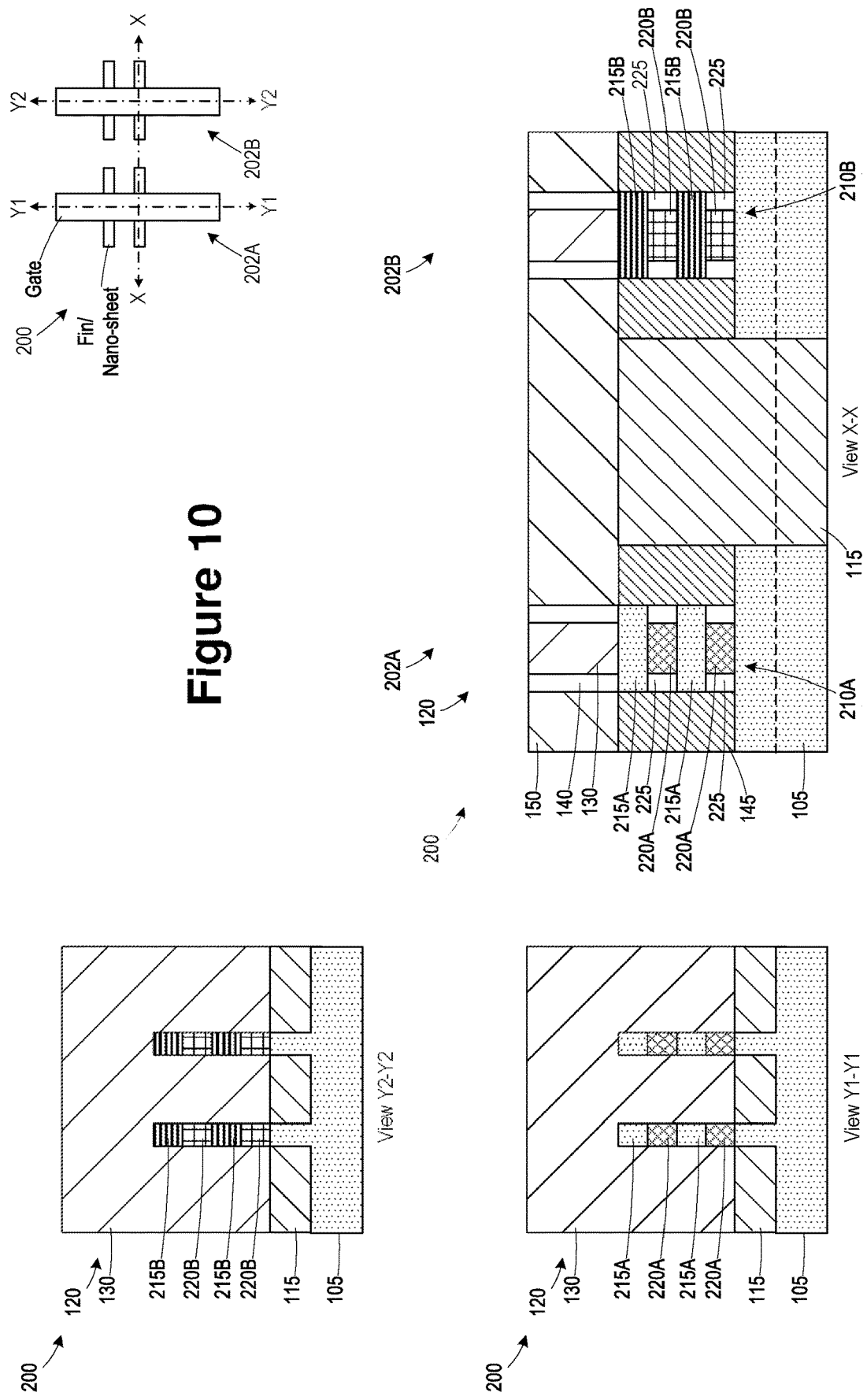

Referring to FIG. 10, a planarization process is performed to remove the cap layer 135 and to reduce a height of the sidewall spacer 140 and the dielectric layer 150, in accordance with some embodiments. The planarization process exposes the sacrificial gate electrode 130. In some embodiments, the planarization process is a continuation of the process performed to planarize the dielectric layer 150.

Figure 11:
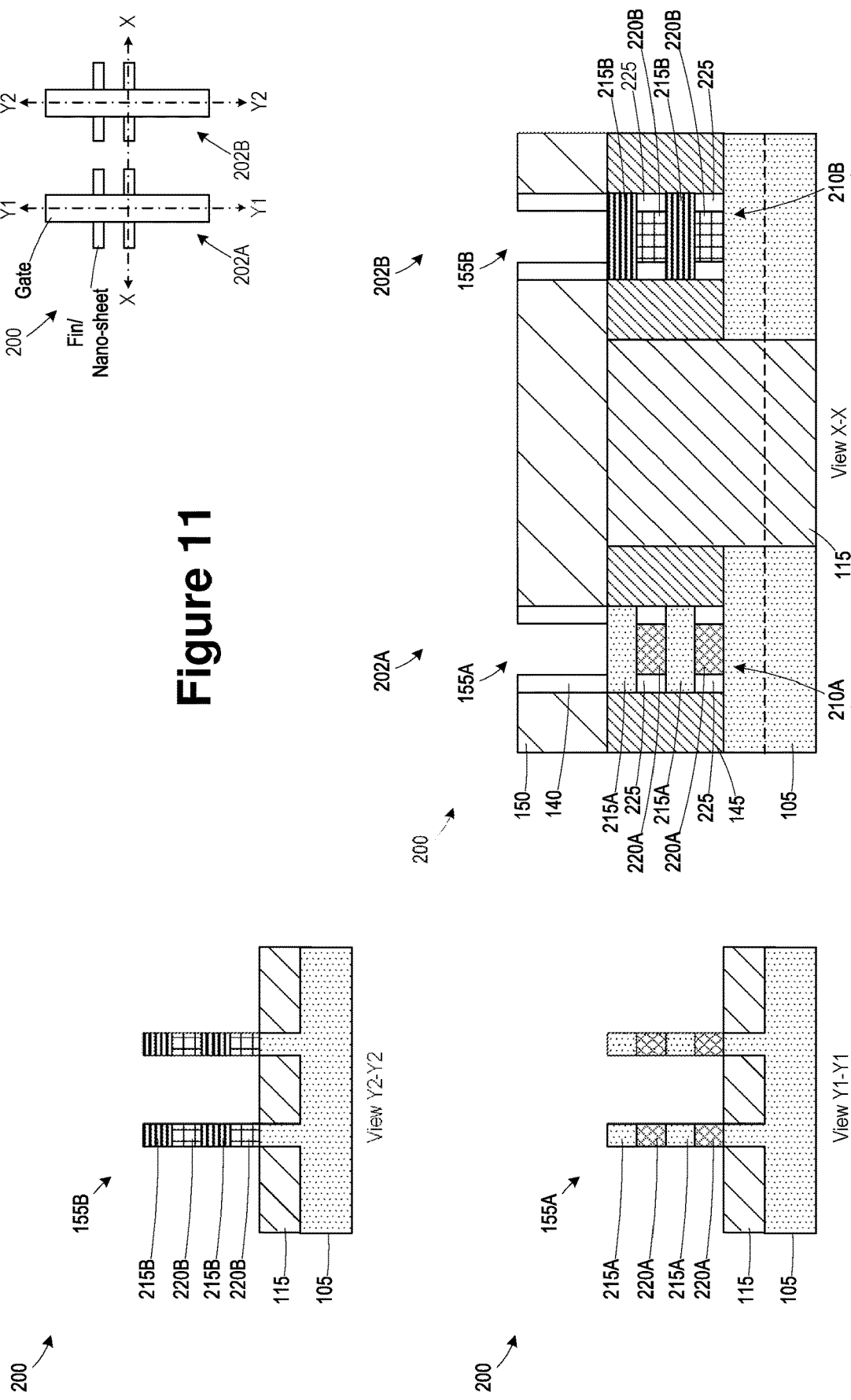

Referring to FIG. 11, an etch process is performed to remove the sacrificial gate electrode 130 to define gate cavities 155A, 155B in accordance with some embodiments. In some embodiments, the etch process is a wet etch process selective to the material of the sacrificial gate electrode 130.

Figure 12:
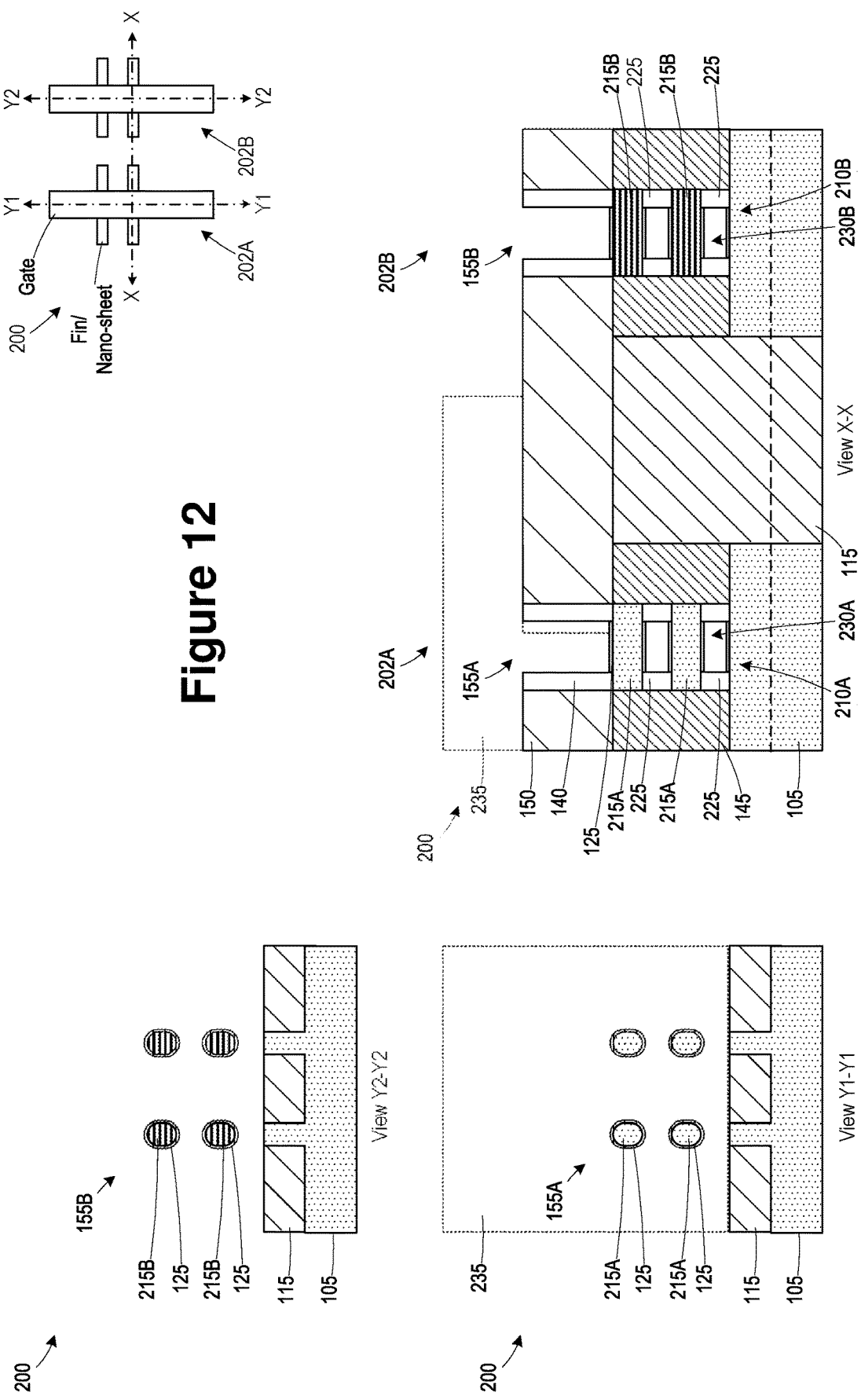

Referring to FIG. 12, an etch process is performed to remove the sacrificial semiconductor layers 220A, 220B to define intermediate cavities 230A, 230B between the active semiconductor material layers 215A, 215B, in accordance with some embodiments. In some embodiments, where the sacrificial semiconductor layers 220A, 220B comprise the same material composition, a concurrent etch process is performed to remove the sacrificial semiconductor layers 220A, 220B. In some embodiments, where the sacrificial semiconductor layers 220A, 220B comprises different material compositions, separate etch processes are used in the presence of masks, such as using a mask layer 235 to remove at least some of the sacrificial semiconductor layers 220A, 220B. For example, the mask layer 235 masks the gate cavity 155A to allow selective removal of the sacrificial semiconductor layer 220B. In some embodiments, an additional mask layer is used to mask the gate cavity 155B and the intermediate cavity 230B to allow selective removal of the sacrificial semiconductor layer 220A.

In some embodiments, the first gate dielectric layer 125 forms on the exposed surfaces of the active semiconductor material layers 215A, 215B during the processing to define the gate cavities 155A, 155B and the intermediate cavities 230A, 230B. In some embodiments, an etch process is performed to remove the first gate dielectric layer 125. In some embodiments, the first gate dielectric layer 125 is a native oxide layer formed by exposure of the semiconductor arrangement 100 to oxygen at various points in the process flow, causing the formation of silicon dioxide on exposed surfaces of the fins 210A, 210B.

According to some embodiments, some erosion occurs on the active semiconductor material layers 215A, 215B during the processing to define the gate cavities 155A, 155B and the intermediate cavities 230A, 230B causing them to have elliptical cross sections.

Referring to FIG. 13, deposition processes are performed to form a second gate dielectric layer 160 in the gate cavities 155A, 155B and over the dielectric layer 150 and to form a third gate dielectric layer 165 over the second gate dielectric layer 160, in accordance with some embodiments. In some embodiments, the second gate dielectric layer 160 comprises a high-k dielectric layer. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3, and each value of y is independently from 0 to 2. In some embodiments, the third gate dielectric layer 165 comprises silicon and oxygen. In some embodiments, the third gate dielectric layer 165 comprises a different material composition than the second gate dielectric layer 160.

Referring to FIG. 14, a process is performed to form a patterned mask layer 170 in the gate cavity 155A in the first region 202A, in accordance with some embodiments. The patterned mask layer 170 exposes the gate cavity 155B in the second region 202B. In some embodiments, the patterned mask layer 170 comprises photoresist.

Figure 15:
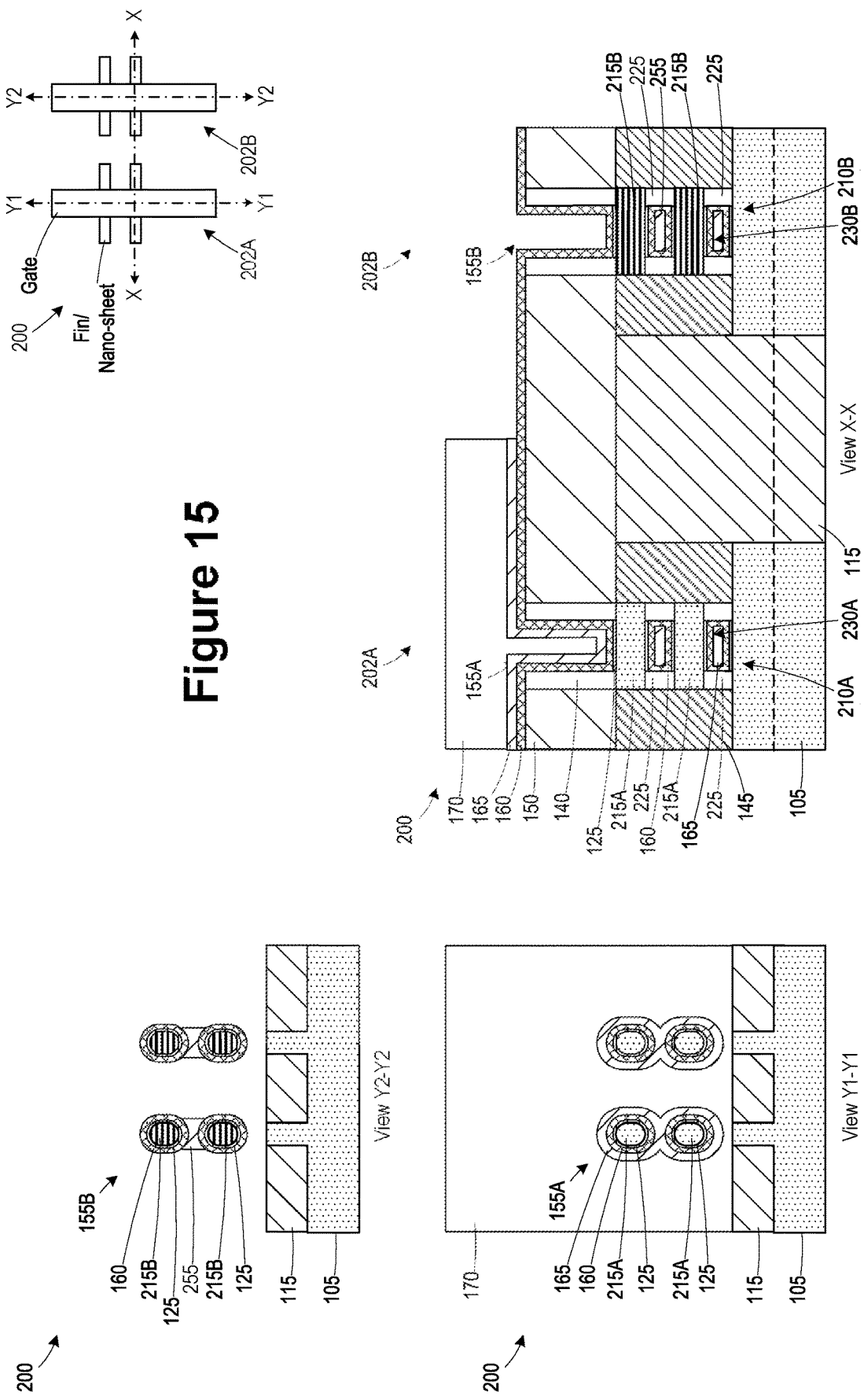

Referring to FIG. 15, an etch process is performed to remove a first portion of the third gate dielectric layer 165 in the second region 102B, in accordance with some embodiments. In some embodiments, a portion 255 of the third gate dielectric layer 165 remains in the intermediate cavity 230B. According to some embodiments, the material of the third gate dielectric layer 165 is selected to provide etch selectivity with respect to the second gate dielectric layer 160. In some embodiments, the remaining portion 255 of the third gate dielectric layer 165 decreases parasitic capacitance between the active semiconductor material layers 215B during operation of the device, thereby potentially increasing performance.

Referring to FIG. 16, the patterned mask layer 170 is removed and processes are performed to form a gate electrode 175 in the gate cavities 155A, 155B, in accordance with some embodiments. In some embodiments, the gate electrode 175 comprises suitable layers in a metal gate stack. In some embodiments, the metal gate stack comprises a work function material (WFM) layer. Example p-type work function metals include TiN, TaN, Ru, Mo, Al, WN, ZrSi2, MoSi2, TaSi2, NiSi2, WN, other suitable p-type work function materials, or combinations thereof. Example n-type work function metals include Ti, Ag, TaAl, TaAlC, TiAlN, TaC, TaCN, TaSiN, Mn, Zr, other suitable n-type work function materials, or combinations thereof. The WFM layer may comprise a plurality of layers. The WFM layer may be deposited by at least one of CVD, PVD, electroplating, or other suitable process. In some embodiments, the metal gate stack comprises a fill layer. In some embodiments, the fill layer comprises tungsten (W) or other suitable material. The fill layer may be deposited by at least one of ALD, PVD, CVD, or other suitable processes. According to some embodiments, a planarization process is performed to remove portions of the material forming the gate electrode 175, the second gate dielectric layer 160, and the third gate dielectric layer 165 positioned over the dielectric layer 150.

Referring to FIG. 17, a recess etch process is performed to recess the gate electrode 175 and a deposition process is performed to form a cap layer 180 over the gate electrode 175, in accordance with some embodiments. In some embodiments, the cap layer 180 comprises silicon and nitrogen. In some embodiments, the cap layer 180 comprises silicon and oxygen.

In some embodiments, the devices in the first region 202A comprise the first gate dielectric layer 125 (i.e., if not removed), the second gate dielectric layer 160, and the third gate dielectric layer 165, and the devices in the second region 202B comprise the first gate dielectric layer 125 (i.e., if not removed) and the second gate dielectric layer 160. In some embodiments, the first region 202A is logic region or an input/output region, and the second region 202B is a core region. In some embodiments, the devices in the first region 202A operate at a higher voltage than the devices in the second region 202B.

In some embodiments, a method for forming a semiconductor arrangement includes forming a first fin in a semiconductor layer. A first gate dielectric layer includes a first high-k material is formed over the first fin. A first sacrificial gate electrode is formed over the first fin. A dielectric layer is formed adjacent the first sacrificial gate electrode and over the first fin. The first sacrificial gate electrode is removed to define a first gate cavity in the dielectric layer. A second gate dielectric layer including a second dielectric material different than the first high-k material is formed over the first gate dielectric layer in the first gate cavity. A first gate electrode is formed in the first gate cavity over the second gate dielectric layer.

In some embodiments, a method for forming a semiconductor arrangement includes forming a first fin including a first semiconductor material layer, a second semiconductor material layer over the first semiconductor material layer, and a third semiconductor material layer over the second semiconductor material layer. A first sacrificial gate electrode is formed over the first fin. A dielectric layer is formed adjacent the first sacrificial gate electrode and over the first fin. The first sacrificial gate electrode is removed to define a first gate cavity in the dielectric layer and to expose a portion of the second semiconductor material layer. The portion of the second semiconductor material layer is removed to define a first intermediate cavity between the first semiconductor material layer and the third semiconductor material layer. A first gate dielectric layer including a first high-k material is formed in the first gate cavity and the first intermediate cavity. A second gate dielectric layer including a second dielectric material different than the first high-k material is formed over the first gate dielectric layer in the first gate cavity and the first intermediate cavity. A first gate electrode is formed in the first gate cavity.

In some embodiments, a semiconductor arrangement includes a first fin and a first gate structure over the first fin. The first gate structure includes a first gate dielectric layer including a first high-k material, a second gate dielectric layer comprising a second material different than the first high-k material over the first gate dielectric layer, and a first gate electrode over the second gate dielectric layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B.

Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first fin;
   a first gate structure over the first fin, the first gate structure comprising:
     a first gate dielectric layer comprising a first high-k dielectric material;
     a second gate dielectric layer comprising a second dielectric material different than the first high-k dielectric material over the first gate dielectric layer, wherein the first gate dielectric layer is between a sidewall of the first fin and a sidewall of the second gate dielectric layer; and
     a first gate electrode over the second gate dielectric layer; and
   a cap layer over the first gate electrode, wherein the first gate structure comprises a sidewall spacer separated from the cap layer by the second gate dielectric layer in a direction parallel to a top surface of the first gate structure.

2. The semiconductor arrangement of claim 1, wherein:
   the sidewall spacer is separated from the first gate electrode by the second gate dielectric layer.

3. The semiconductor arrangement of claim 1, comprising:
   a third gate dielectric layer under the first gate dielectric layer.

4. The semiconductor arrangement of claim 3, wherein:
   the sidewall spacer is in direct contact with the first gate dielectric layer and the third gate dielectric layer.

5. The semiconductor arrangement of claim 3, wherein the third gate dielectric layer is between the sidewall of the first fin and a sidewall of the first gate dielectric layer.

6. The semiconductor arrangement of claim 1, wherein the sidewall spacer is separated from the cap layer by the first gate dielectric layer in the direction parallel to the top surface of the first gate structure.

7. The semiconductor arrangement of claim 1, wherein the sidewall spacer is separated from the first gate electrode by the first gate dielectric layer.

8. The semiconductor arrangement of claim 1, comprising:
   a second fin; and
   a second gate structure over the second fin, the second gate structure comprising:
     the first gate dielectric layer; and
     a second gate electrode in direct contact with the first gate dielectric layer.

9. The semiconductor arrangement of claim 1, wherein the first gate electrode is separated from the first fin by the first gate dielectric layer and the second gate dielectric layer.

10. A semiconductor arrangement, comprising:
    a first fin;
    a first gate structure over the first fin, the first gate structure comprising:
      a first gate dielectric layer;
      a second gate dielectric layer over the first gate dielectric layer;
      a third gate dielectric layer over the second gate dielectric layer; and
      a first gate electrode over the third gate dielectric layer and spaced apart from the second gate dielectric layer by the third gate dielectric layer;
    a second fin; and
    a second gate structure over the second fin, the second gate structure comprising:
      the first gate dielectric layer;
      the second gate dielectric layer over the first gate dielectric layer; and
      a second gate electrode over the second gate dielectric layer and in direct contact with the second gate dielectric layer.

11. The semiconductor arrangement of claim 10, wherein:
    the first gate structure comprises a sidewall spacer, and
    the sidewall spacer is separated from the third gate dielectric layer by the second gate dielectric layer.

12. The semiconductor arrangement of claim 11, wherein the sidewall spacer is in direct contact with the second gate dielectric layer.

13. The semiconductor arrangement of claim 10, wherein:
    the first gate structure comprises a sidewall spacer, and
    the sidewall spacer is in direct contact with the second gate dielectric layer.

14. The semiconductor arrangement of claim 10, comprising:
    a cap layer over the second gate electrode, wherein the second gate structure comprises a sidewall spacer separated from the cap layer by the second gate dielectric layer in a direction parallel to a top surface of the second gate structure.

15. A method for forming a semiconductor arrangement, comprising:
    forming a first gate electrode;
    forming a dielectric layer adjacent the first gate electrode;
    removing the first gate electrode to define a first gate cavity in the dielectric layer;
    forming a first gate dielectric layer comprising a first high-k dielectric material in the first gate cavity;
    forming a second gate dielectric layer comprising a second dielectric material different than the first high-k dielectric material over the first gate dielectric layer in the first gate cavity, wherein a sidewall of the dielectric layer is separated from a second sidewall of the second gate dielectric layer by the first gate dielectric layer;

forming a second gate electrode in the first gate cavity over the second gate dielectric layer; and recessing the second gate electrode to reduce a height of the second gate electrode such that an uppermost surface of the second gate dielectric layer is above an uppermost surface of the second gate electrode.

16. The method of claim 15, comprising:

forming a first fin, wherein the first gate dielectric layer is between a sidewall of the first fin and a first sidewall of the second gate dielectric layer.

17. The method of claim 15, comprising:

forming a third gate dielectric layer, wherein forming the first gate dielectric layer comprises forming the first gate dielectric layer over the third gate dielectric layer.

18. The method of claim 15, wherein:

recessing the second gate electrode in the first gate cavity defines a recess; and the method comprises forming a cap layer in the recess over the second gate electrode.

19. The method of claim 15, comprising:

defining a second gate cavity in the dielectric layer;

forming the first gate dielectric layer in the second gate cavity;

forming the second gate dielectric layer in the second gate cavity;

removing the second gate dielectric layer from the second gate cavity; and forming a third gate electrode in the second gate cavity over the first gate dielectric layer after removing the second gate dielectric layer from the second gate cavity.

20. The method of claim 18, comprising:

wherein forming the cap layer comprises forming the cap layer to directly contact a sidewall of the second gate dielectric layer.

\* \* \* \* \*